US005559360A

United States Patent [19]

Chiu et al.

[11] Patent Number: 5,559,360

[45] Date of Patent: Sep. 24, 1996

[54] INDUCTOR FOR HIGH FREQUENCY CIRCUITS

[75] Inventors: Tzu-Yin Chiu, Martinsville, N.J.; Frank M. Erceg, Bethlehem, Pa.; Duk Y. Jeon, Seoul, Rep. of Korea; Janmye Sung, Warren, N.J.

[73] Assignee: Lucent Technologies Inc., Murray Hill, N.J.

[21] Appl. No.: 359,309

[22] Filed: Dec. 19, 1994

[51] Int. Cl.$^6$ .......................... H01L 29/00; H01F 27/06; H01F 27/28; H01F 5/00

[52] U.S. Cl. .......................... 257/531; 257/773; 257/728; 257/698; 336/65; 336/200; 336/220

[58] Field of Search .................................. 257/531, 528, 257/773, 728, 379, 691, 698, 730; 336/200, 220, 65

[56] References Cited

U.S. PATENT DOCUMENTS

| | | | |
|---|---|---|---|
| 4,979,016 | 12/1990 | Lee | 257/668 |
| 5,027,255 | 6/1991 | Zeitlin et al. | 361/739 |
| 5,039,964 | 8/1991 | Ikeda | 336/200 |
| 5,206,623 | 4/1993 | Rochette et al. | 338/203 |
| 5,225,969 | 7/1993 | Takaya et al. | 361/795 |
| 5,233,310 | 8/1993 | Inoue | 330/277 |
| 5,243,319 | 9/1993 | Brokaw | 338/195 |

FOREIGN PATENT DOCUMENTS

| | | | |
|---|---|---|---|
| 2269057 | 1/1994 | United Kingdom | 336/200 |

OTHER PUBLICATIONS

J. Y. C. Chang and Michael Gaitan, "Large Suspended Inductors on Silicon and Their Use in a 2–μm CMOS RF Amplifier", IEEE Electron Device Letters, vol. 14. No. 5, May 1993 pp. 246–248.

K. B. Ashby, W. C. Finley, J. J. Bastek, S. Moinian and I. A. Koullians, "High Q Inductors For Wireless Application In a Complementary Silicon Bipolar Process", 1994 Bipolar/BiCMOS Circuits & Technology Meeting pp., 179–182.

*Primary Examiner*—Sara W. Crane
*Assistant Examiner*—Alice W. Tang

[57] ABSTRACT

An inductor fabricated for semiconductor use is disclosed. The inductor is formed with a multi-level, multi-element conductor metallization structure which effectively increases conductance throughout the inductor thereby increasing the inductor's Q. The structure of the inductor may also provide for routing the current flowing through the multi-level, multi-element conductors in a way that increases the self inductance between certain conductive elements, thereby increasing the inductor's total inductance.

14 Claims, 6 Drawing Sheets

INDUCTOR FOR HIGH FREQUENCY CIRCUITS

BACKGROUND OF THE INVENTION

1. Field of the Invention

The present invention relates to inductors for use in high frequency circuits, and more particularly to high frequency inductors integrated within semiconductor integrated circuitry.

2. Description of the Related Art

Efforts to fabricate large value inductors on silicon (Si) substrates for high frequency use during the 1960's proved ineffective. Self-resonance occurring within the inductive structure and low quality factors (Qs) limited inductor use at high frequencies. R. M. Warner, Ed., *Integrated Circuits, Design Principles and Fabrication*, McGraw Hill, 1965. Series resistance inherent within the aluminum/silicon formed inductors led to a reduction in quality factor with increasing frequency.

Typically, large value inductors are fabricated as aluminum (Al) or gold (Au) spirals with multiple turns on various semiconductor substrates. Increasing inductance, however, brings a concomitant increase in parasitic resistance (and capacitance), lowering the inductor's self-resonant frequency. For example, 25 nH spiral inductors fabricated with gold on GaAs or insulating sapphire substrates are found to self-resonate at approximately 3 GHz. In contrast, spiral inductors as small as 10 nH, formed with aluminum on Si substrates, are found to self-resonate at 2 GHz, and to display a decreased Q relative to the GaAs and insulated sapphire substrate formed inductors. Chang, et al., *Large Suspended Inductors on Silicon And Their Use In A* 2-μm *CMOS RF Amplifier*, IEEE Electron Device Letters, Vol. 14, No. 5, pgs. 246–248, May, 1993.

Inductors formed by silicon process require relatively thin aluminum (A1) conductive layers (i.e., around 0.5 μm), especially in multilevel designs, compared to the relatively thick gold (Au) conductive layers formed on column III–V semiconductors (i.e., around 6 μm). The shallow depth of the A1 conductor lends itself to higher resistances relative to thicker conductive paths. The width (W) of an A1 layer disposed on a Si substrate may however, be increased to compensate for its shallow depth. The increased width results in an increased conductance and therefore an improvement in the inductor's Q. The relationship between the improved Q and increasing W, however, is not linear. At higher frequencies, current does not flow through the entire cross-sectional area of the conductor (i.e., all of the increased width), leading to current crowding. Improvement in Q with increasing conductive path width is found to diminish as W increases beyond 15 μm, as shown in the plot of FIG. 1. Current crowding is believed to play a significant role in the changes in Q with increasing conductor width, becoming significant at widths beyond 15 μm.

FIG. 2 shows a portion of a conventional spiral inductor L20 formed with an aluminum conductor 24 on a silicon substrate 22. W and L represent the conductor's width and length, respectively. Because the outer conductive path is longer than the inner conductive path, the effective resistance of the outer path is greater than that of the inner path. Current, therefore, taking the path of least resistance, tends to flow along the inner path, leading to current crowding. The current crowding effect appears to increase with increasing frequency. More specifically, the outer length, $L_o$, of the conductor 24 is:

$$L_o = -S + \sum_{n=1}^{N} 4[L - 2(n-1)(W+S)] - (W+S) + S$$

wherein N is the number within the spiral. The inner length, $L_i$, is:

$$L_i = W + \sum_{n=1}^{N} 4[(L-2W) - 2(n-1)(W+S)] - (W+S) + S$$

As L and/or W increases, $L_o/L_i$ increases. At certain ratio or beyond, the current crowding occurs and the effective resistance increases which degrades the overall quality factor, Q.

For example, at N=1 and assuming W>>S, $L_o/L_i$=(4L-W)/(4L8W). If defining $L_o/L_i$>1.5 as the threshold of significant current crowding, significant crowding should be found to occur at W>L/5.5. Similarly at N=2, the defined threshold of current crowding occurs when W>L/7; W>L/8 in the case of N=3. With simple mathematics, the criterion for the threshold for current crowding at higher coil numbers can be easily derived. As N increases, the ratio of the outer length/inner length of tile inner conductor coils increases.

SUMMARY OF THE INVENTION

The present invention provides an inductor fabricated for semiconductor use which displays a self-inductance and increased Q not realizable with conventional integrated inductor fabrication techniques. The inductor of this invention, therefore, does not readily resonate at frequency ranges within which inductors formed on integrated circuits by conventional methods tend to resonate and may consequently be utilized in higher frequency applications.

In one form, tile inductor of this invention provides a multi-level, multi-element conductive metalization structure which maintain s conductance throughout the conductive structure with increasing frequency. To accomplish this, the effective distance between multiple, parallel current elements forming the inductor are rendered substantially equal thereby equalizing each element's resistance. Accordingly, the conductive path formed with the combination of equidistant, equiresistant elements overcomes problems due to current crowding inherent within inductors formed according to the prior art. The multi-element structure therefore improves the overall effective conductance through the inductor, and lends itself to improved Q.

In addition, the invention provides structure for routing the current flowing through multi-level, multi-element conductors in a way that increases the inductor's total inductance. The overall increased inductance is accomplished utilizing a cumulative effect of an increased self-inductance derived from each conductive element. The self-inductance of each conductive element comprising the conductive path of the inductor is increased by the unique layout provided by the invention. By combining the structural scheme providing the increased inductance and decreased resistance described above, an inductor may be provided by this invention that will display both a large inductance and high Q. The inductor formed according to this invention is ideal, therefore, for implementation within semiconductor integrated circuits which operate at high frequencies.

DETAILED DESCRIPTION OF THE INVENTION

The inductor for high frequency (HF) semiconductor circuits of this invention provides structure whereby multiple parallel conductive elements are arranged on a substrate (e.g., silicon) in lieu of a single element conductive path of a prior art inductor. When referred to herein, high frequency describes a range extending from about 100 MHz to about 10 GHz. The multi-element structure is arranged to assure that the total resistance of the summation of the resistances of the current carrying elements forming the inductor is decreased relative to the resistance of the conductive path of equal dimension forming a conventional inductor. In addition, the structure by which inductors of this invention are formed may realize an increase in self-inductance between conductive elements, leading to an increase in the total inductance within the inductor. The decreased resistance and increased inductance are responsible for previously unattainable values of Q for an inductor formed with Al on a silicon substrate. A previously unattainable value of Q, at which inductive structures defined herein operate at high frequencies, may be as high as 15.

Figure 3A:
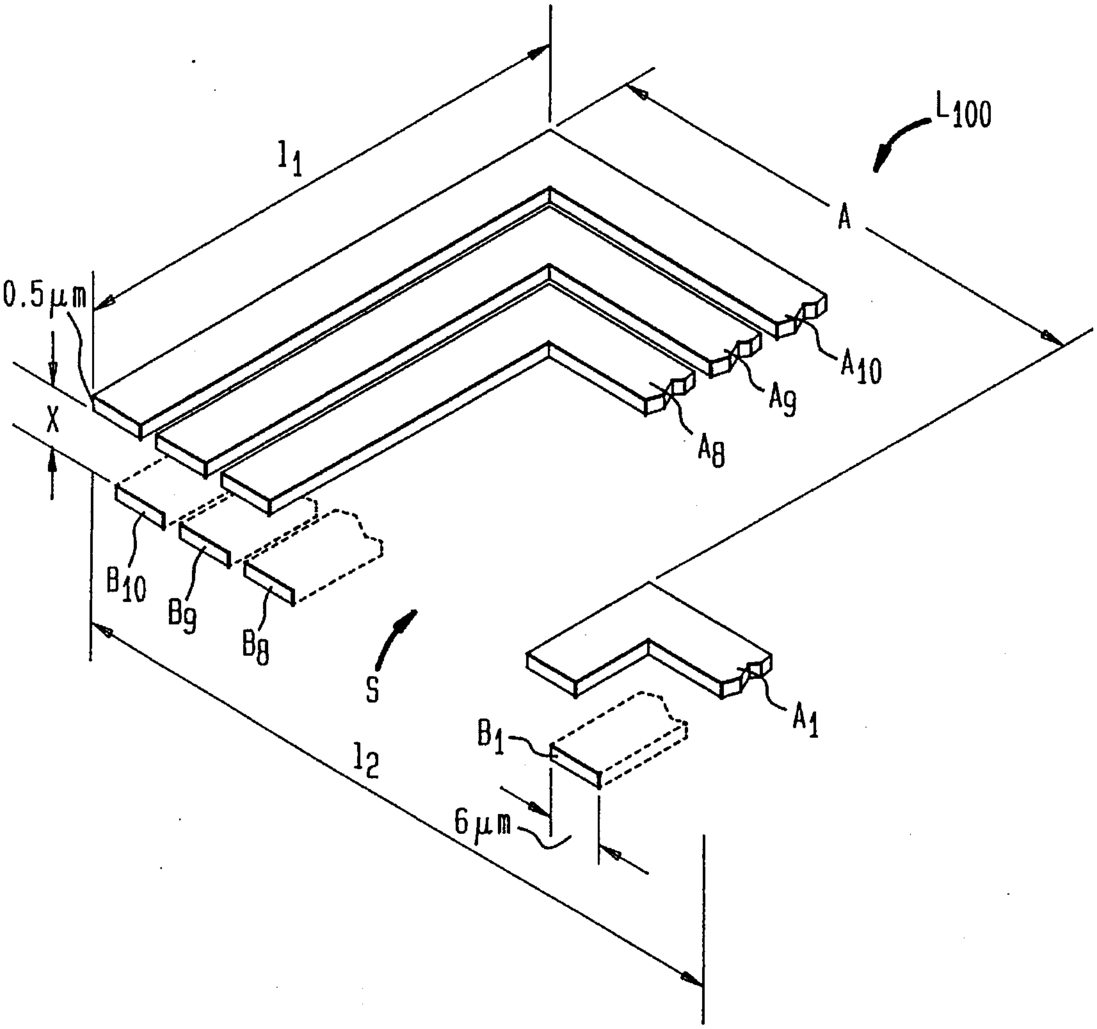
FIG. 3A is a perspective view of one embodiment of an inductor for high frequency circuits of this invention.

Referring now to FIGS. 3–5, the principles of this invention will be described. FIG. 3A shows a portion of the structure of this invention, embodying an inductor L100. The inductor comprises a conductive path shown formed as varying "A" elements along a portion identified as length $\mathbf{1}_1$ of a first metallization level disposed on a dielectric substrate S. A second metallization level "B" forming a second conductor or conductive path (also along the side $\mathbf{1}_1$) is disposed opposite the first conductive path A on substrate S, at a distance X from path A. Each of conductive paths A and B are constructed with ten different, substantially parallel conductive elements, identified as $A_1$, $A_2$, . . . $A_{10}$, and $B_1$, $B_2$ . . . $_{B10}$, respectively. The width of each element is approximately 6μm. An insulative (dielectric) spacing of approximately 1μm exists electrically separating each of the ten parallel elements forming conductive paths A and B. The effective total width of each of conductive paths A and B is approximately 70 μm. The "A" and "B" formed conductive path elements extend from corners formed at the ends of their respective lengths at side $\mathbf{1}_1$ along the side of the inductor identified as $\mathbf{1}_2$ in the Figure, etc., forming a spiral.

Figure 1:
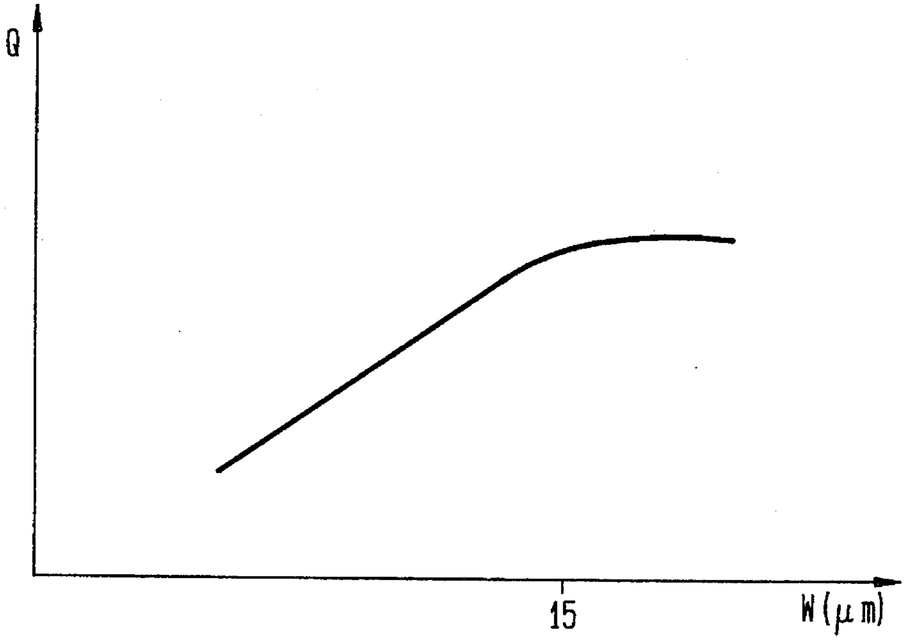
FIG. 1 (PRIOR ART)
FIG. 1 is a plot of quality factor (Q) versus conductor width (W) for an A1 formed silicon inductor of the prior art.
Figure 2:
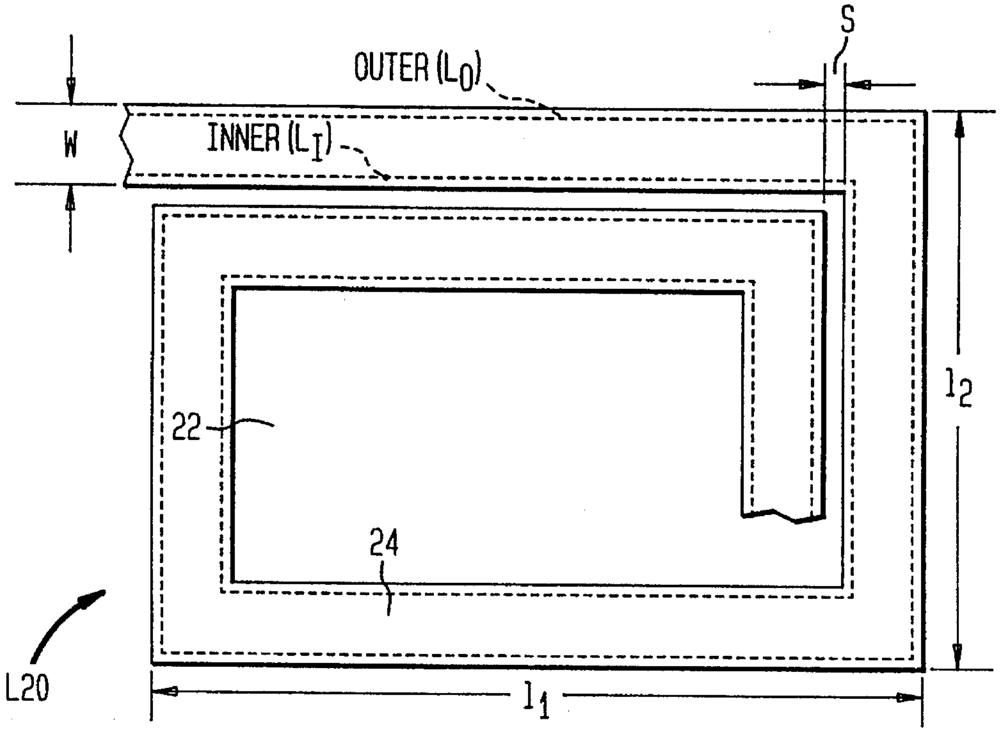
FIG. 2 is a plan view of a portion of a spiral inductor formed with a convention fabrication technique.

The overall lengths of the conductive elements forming each of conductive paths A and B relate according to the following: $A_{10}>A_9>. . . A_1$, and $B_{10}>B_9>. . . B_1$. Were each of the ten elements of conductive path A, and conductive path B electrically connected in parallel, as discussed above with reference to FIG. 2 of the prior art, there would be a tendency for the current to crowd the innermost (shortest) conductive path elements, the elements of least current resistance with increasing frequency. Current crowding would then occur within the innermost elements as a function of increasing frequency, producing a concomitant increase in parasitic resistance within those shorter length elements.

Figure 3B:
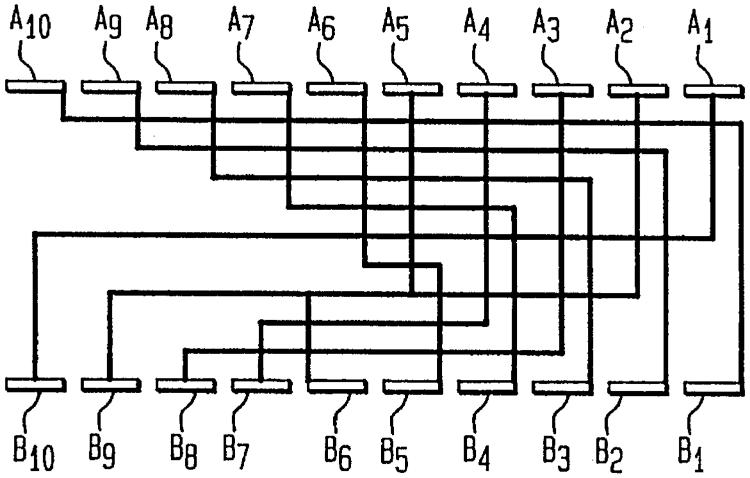
FIG. 3B is a side view of the inductive structure of FIG. 3A.

The structure shown in FIGS. 3A and 3B overcomes the increased resistance resulting from a tendency of current to crowd the shorter of the conductive elements by substantially equalizing the lengths of all the conductive elements. Assuming that the lengths corresponding to the A and B sequential conductive elements are the same, i.e., $A_3=B_3$, $A_6=B_6$, etc., connecting an inner element $A_1$ to an outer element $B_{10}$, $A_2$ to $B_9$, . . . $A_{10}$ to $B_1$, effectively equalizes the length of each of ten new A-B formed conductive elements. The connections to establish the construction of this invention are shown in FIG. 3B. Because each of conductive paths A and B contain ten sequential conductive elements, respectively, the conductive elements shown in FIG. 3B may be referred to as being connected inverse sequentially. Equal element lengths provide for substantially equal resistances in each or the elements comprising each path. Theoretically, current will flow equally in any one of the ten substantially equilength, equiresistant elements when the ten newly formed A-B paths are connected in parallel. The substantially equal distribution of current over the width of the conductor (i.e., the parallel combination of the newly formed ten conductive elements) minimizes current crowding in any one conductive element providing for a decrease in resistance and therefore an increase in Q.

While the structure of FIGS. 3A and 3B was referred to as an inductor, the structure of this invention formed to define equilength, equiresistant conductive paths is not limited to inductive structure. The described structure may be utilized to form any conductive structure, such as a resistor, that would show improved conductive characteristics as a result of equilength, equiresistant conductive elements forming a current path. Further, while the above structure was described with 10 elements, the number of elements is not limited to 10, but may be any number N according to needs of the circuit within which the structure operates.

Figure 4A:
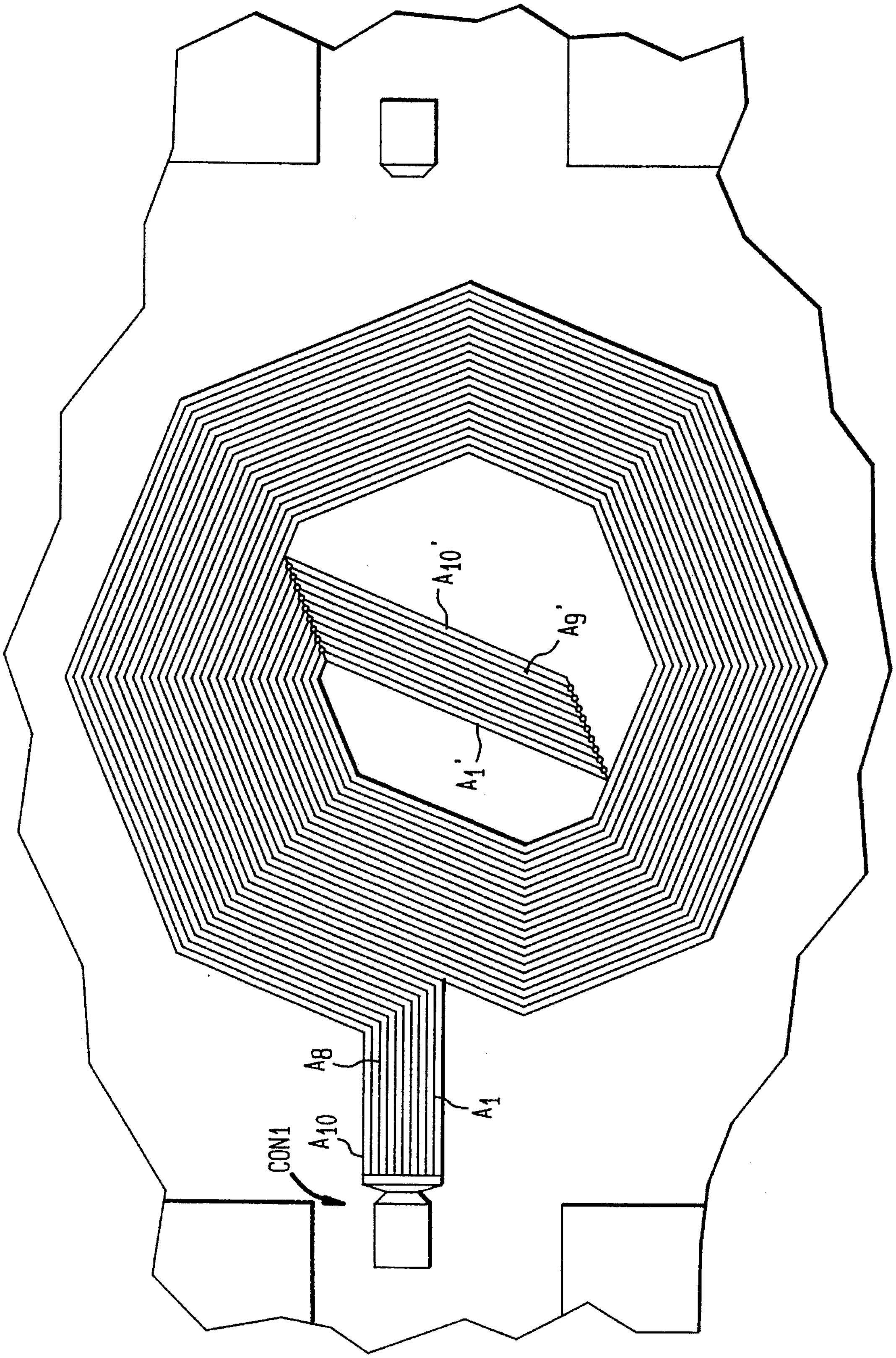
FIG. 4A and 4B are schematic layouts which together detail the bi-level interconnection of one form of the embodiment of the inductive structure of FIGS. 3A and 3B.
Figure 4B:
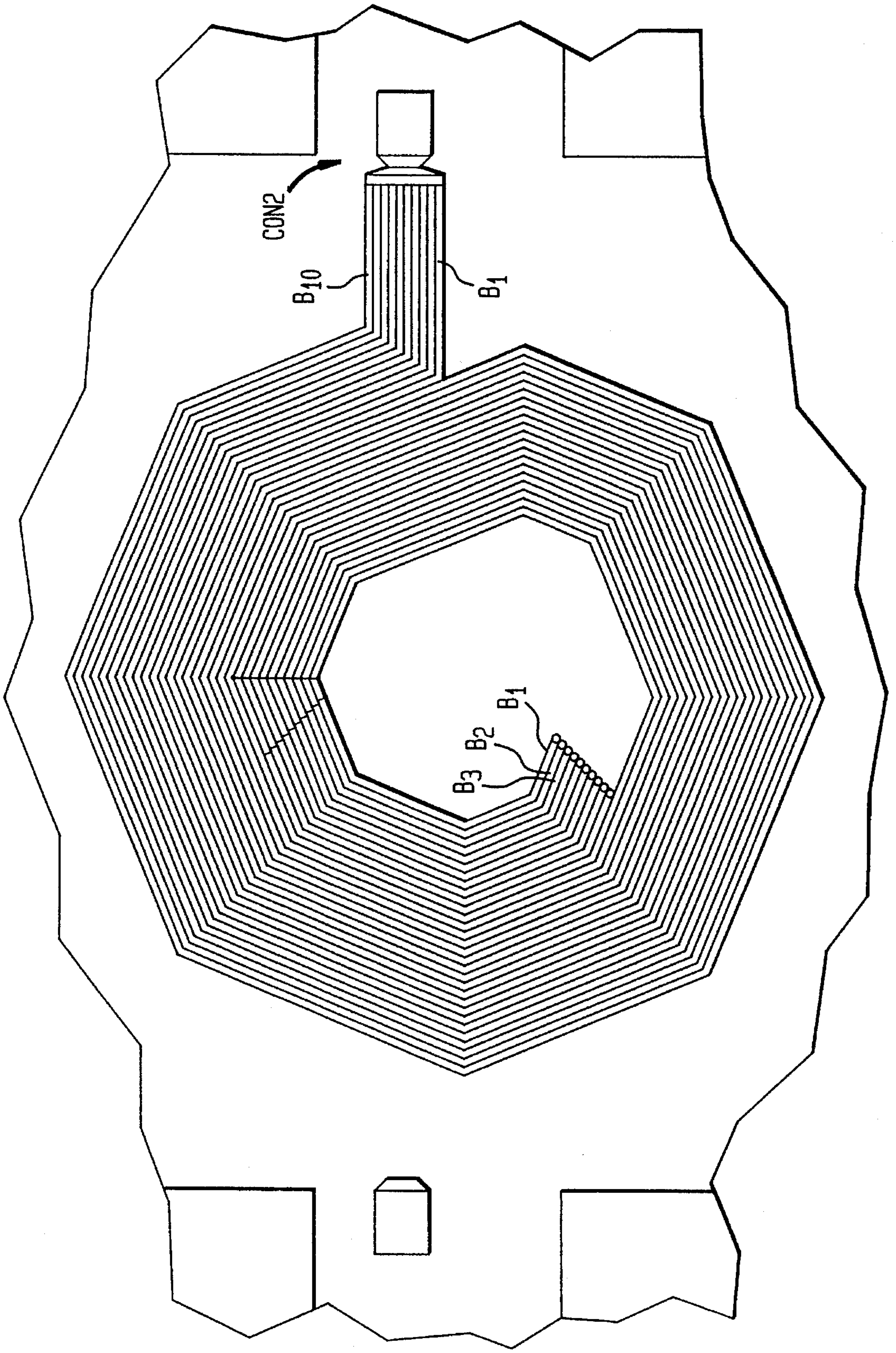

FIGS. 4A and 4B are a schematic layout depicting one form of the invention depicted in FIGS. 3A and 3B and described above. FIG. 4A shows the layout of the first layer, the $A_1$ through $A_{10}$ layer, where the parallel interconnection of the first ends of the "A" level conductive elements is designated by the connective structure CONI. A group of 10 connective wires, $A_1$', A2' . . . A10' are shown in the center of the spiral at which the elements $B_1$ through $B_{10}$ of the second layer (FIG. 4B) are connected inverse sequentially. The output of spiral is identified as a parallel connection CON2 in FIG. 4B, which form the parallel connections of all of the elements of the "B" level.

In addition to the above-described improvement in current conductivity, the multi-element inductive structure of this invention may be arranged to increase the overall inductance. To do so, the structure is arranged to utilize a summation of the mutual or self-inductances induced within each separate conductive element within adjacent elements forming said inductor. The scheme or arrangement by which the mutual or self inductances are utilized may be referred to as "line mixing". Line mixing essentially takes advantage of the parasitic inductances between adjacent conductive elements. Mutual inductance between two conductors of length 1, separated by distance d, is given by:

$$5l[ln(1/d+G)+H+d/1],$$

where $G+[1+(1/d)^2]^{1/2}$ and $H=[1+(d/1)^2]^{1/2}$.

It is clear from these equations, therefore, that the smaller the d, that is, the closer the conductive elements, the larger the inductance produced in each as a result of current flowing in adjacent elements.

Figure 5A:
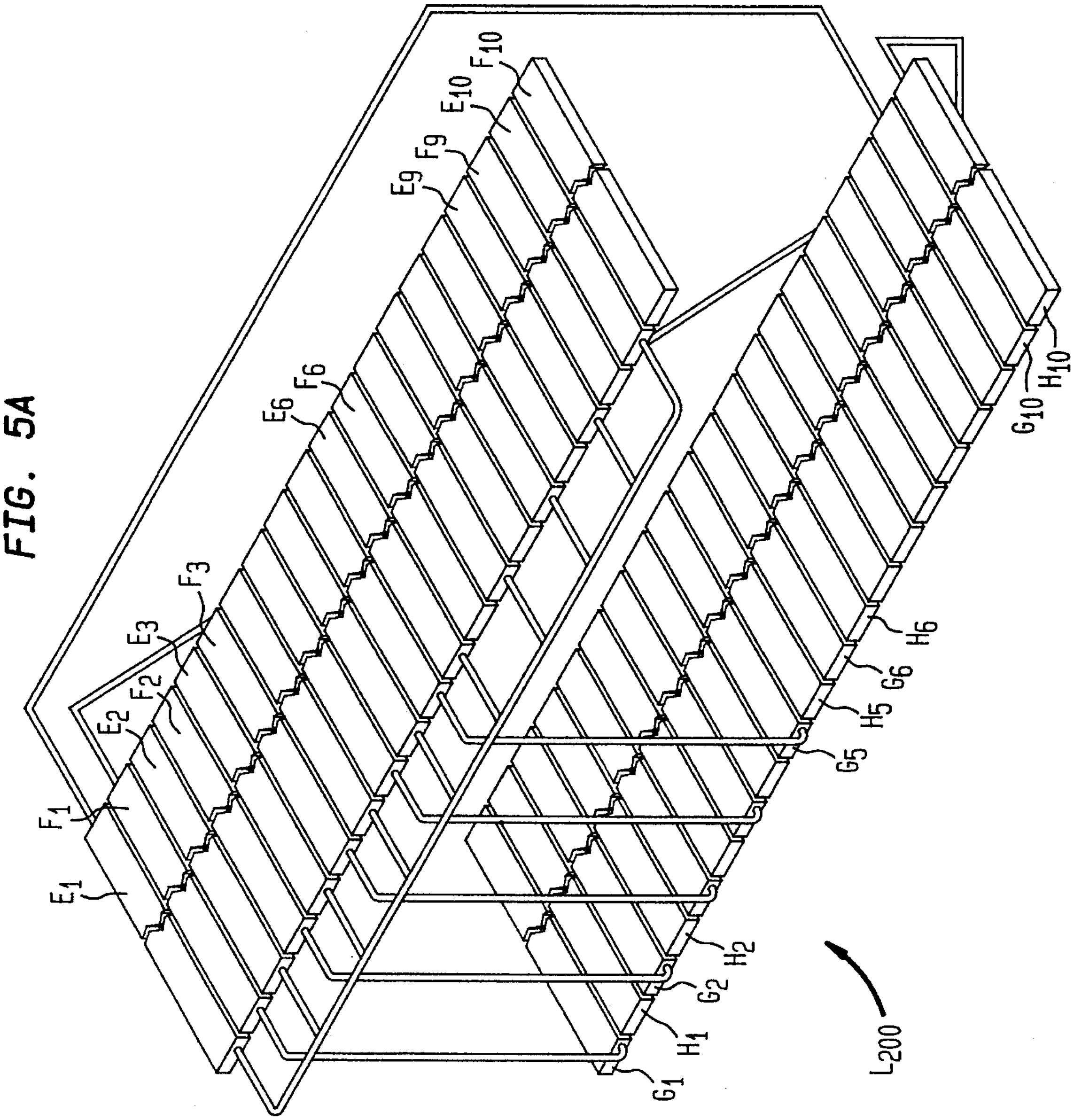
FIG. 5A is a side perspective view of elements forming another embodiment of an inductor for high frequency circuits of this invention.

FIG. 5A shows an inductive structure wherein ten parallel conductive elements $E_1, E_2, \ldots E_{10}$, formed on a dielectric substrate, are "mixed" with each of ten parallel conductive elements $F_1, F_2, \ldots F_{10}$. The ten "F" elements are interposed between elements $E_1, E_2, \ldots E_{10}$, on the substrate. The result is ten pairs of parallel conductive elements, $E_1$, $F_1$, $E_2$, $F_2$, $\ldots E_{10}$, $F_{10}$. The distance separating the elements of each pair, e.g., $E_1$, $F_1$, is approximately 7μm. Also shown in FIG. 5A is a second level of parallel conductive elements disposed on the a dielectric substrate opposite the first level and arranged as follows: $G_1, H_1, \ldots G_5, H_5, G_6, H_6, \ldots G_{10}$. The connection between conductive elements is as follows. The back end of Element $E_1$ from the upper level is electrically connected to the back end of element $G_{10}$ of the lower level, the back end of $E_2$, to the back end of $G_9$, $E_3$ to $G_8$, . . . etc., i.e., inverse sequentially. Each of elements $E_1$ through $E_{10}$ are electrically connected in parallel at the front end. Then, the front ends of each of conductive elements $G_1$ through $G_{10}$ are electrically connected to each of the front ends elements $F_1$ through $F_{10}$. The back ends of elements $F_1$ through $F_{10}$ are then electrically connected inverse sequentially to the back ends of elements $H_1$ through $H_{10}$. An example of one of the 10 formed element paths extends from $E_1$ to $G_{10}$ to $F_{10}$ to $H_1$. Accordingly, the mutual inductance generated from current flowing through the conductive path elements as a result of the proximity of $E_{1\ to\ F1}$, and $G_{10}$ to $H_{10}$, and $E_2$ to $F_2$, and $G_9$ to $H_9$, etc., adds to the overall inductance. Tile inductor of FIG. 5A displays both the improved conductance of the structure described in FIGS. 3A and 3B, and the increased total inductance resulting from mutual inductance between proximate conductive elements.

Figure 5B:
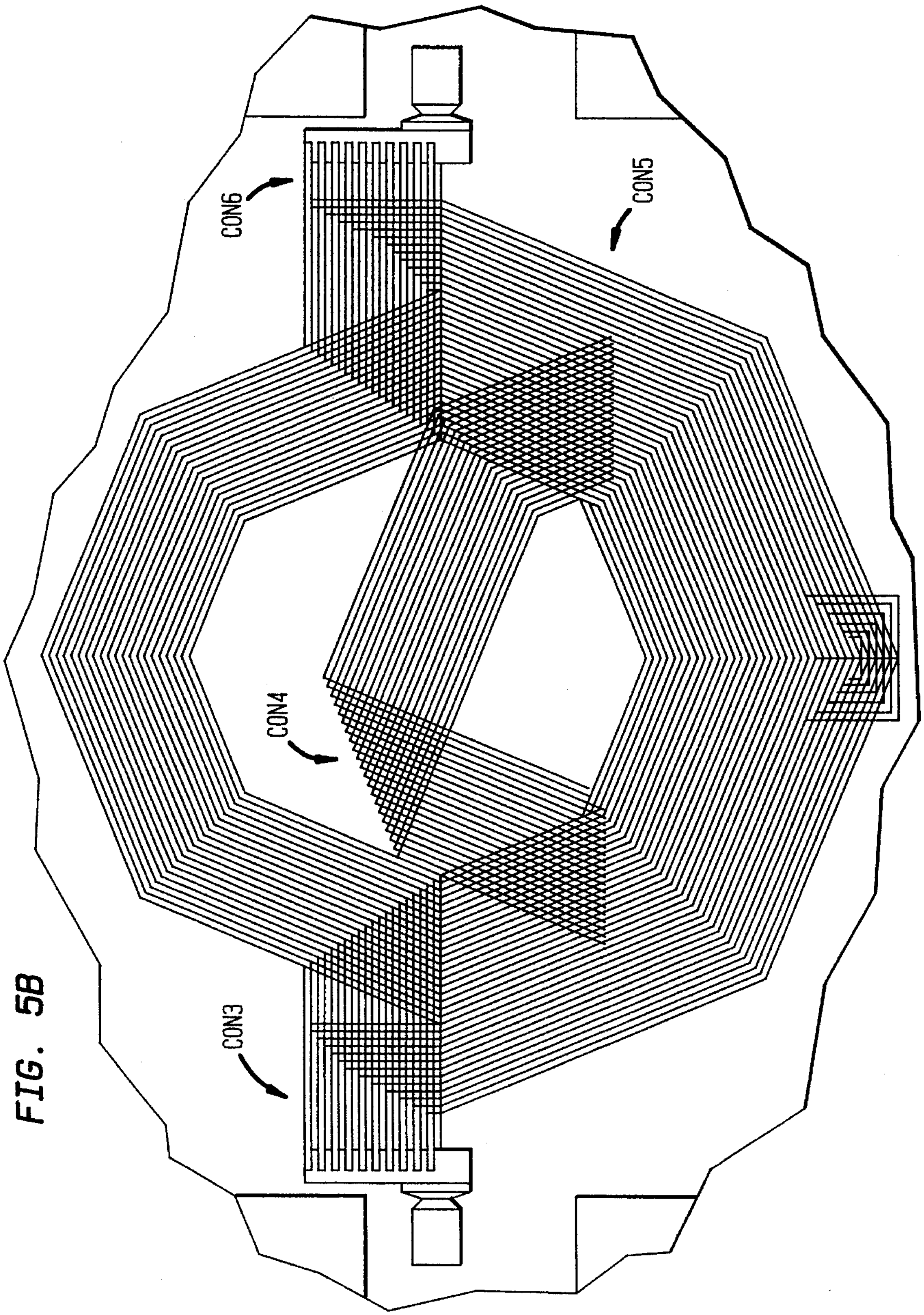
FIG. 5B is a schematic layout of one form of the embodiment of the inductor of FIG. 5A.

FIG. 5B is a schematic layout depicting an inductive structure displaying the increased inductance and increased conductance as described above with reference to FIG. 5A. In the Figure, the portion identified as CON3 is where each of the front ends of elements $_1$ through $E_{10}$ are connected in parallel. At portion CON4, top layer elements $E_1$ through $E_{10}$ are connected inverse sequentially to the back ends of second layer elements $G_1$ to $G_{10}$. At portion Con 5, the front ends of elements $G_1$ through $G_{10}$, are connected sequentially to the front ends of elements $F_1$ through $F_{10}$. Then, at CON 3, the back ends of elements $F_1$ through $F_{10}$ are connected inverse sequentially to the back ends of elements $H_1$ through $H_{10}$.

The above-described layout (structure) of the ten equally resistive, quad EGFH conductive elements provides for both an increased conductance due to the neglible effects of current crowding, and increased total inductance within the inductor for a higher Q. The described layout, however, is merely illustrative of one possible implementation of this invention. Varying the interconnection of the conductive elements varies the distances between elements, and, therefore, the mutual inductances. For example, the bi-level elements above could have been arranged on an upper level as $E_1, F_1, \ldots E_5, F_5, F_6, E_6, \ldots F_{10}, E_{10}$, and on a lower level as $G_1, H_1, \ldots G_5, H_5, H_6, G_6, \ldots H_{10}, G_{10}$, or for that matter, other combinations arranged by those skilled ill the arts.

What has been described herein is merely illustrative of the application of the principles of the present invention. Other arrangements and methods can be implemented by those skilled in the art without departing from the spirit and scope of this invention.

What is claimed is:

1. An integrated circuit for use in high frequency applications that includes an inductive structure, said structure comprising:

a) a first electrical conductor comprising a sequence of substantially parallel first conductive elements electrically connected in parallel, each having first and second ends and disposed sequentially to form a first planar pattern, said first conductive elements having unequal electrical lengths and being electrically isolated from each other along said first pattern; and a second electrical conductor b) comprising a sequence of substantially parallel second conductive elements connected in parallel, each having first and second ends and disposed sequentially to form a second planar pattern, said second conductive elements having unequal electrical lengths and being electrically isolated from each other along said second pattern, said first planar pattern separated from said second planar pattern by a layer of dielectric material, wherein individual said second ends of sequentially longer ones of said first conductive elements are electrically coupled to individual first ends of sequentially shorter ones of said second conductive elements thereby forming a combination of substantially equal length, equiresistant conductive elements from said first ends of said first conductive elements to said second ends of said second conductive elements.

2. The integrated circuit of claim 1, wherein said high frequency applications describe a range extending from about 100 MHz to about 10 GHz.

3. The integrated circuit defined by claim 1, wherein said inductive structure further comprises:

a) a third electrical conductor having a width W and a length L comprising a sequence of substantially parallel electrically isolated, conductive elements having first and second ends, wherein each sequential conductive element of said third conductor is juxtaposed with each sequential element of said first conductor; and b) a fourth electrical conductor having a width W and a length L comprising a sequence of substantially parallel, electrically isolated, conductive elements having first and second ends, wherein each sequential conductive element of said fourth conductor is juxtaposed with each sequential element of said second conductor, wherein second ends of said conductive elements of said third conductor are electrically connected inverse sequentially to first ends of said conductive elements of said fourth conductor, and wherein said second ends of said elements of said second conductor are electrically connected sequentially to said first ends of said elements of said third conductor forming a sequence of substantially equal length, equiresistant, conductive elements.

4. The integrated circuit defined by claim 3, wherein said first end of said conductive elements of said first conductor are electrically connected and said second ends of conductive elements of said fourth conductor are electrically connected thereby defining a single conductive path formed of separate, parallel connected substantially equiresistant, equilength elements.

5. An inductive structure integrable with a semiconductor integrated circuit, comprising:

a) a dielectric substrate;

b) a first electrical conductor comprising a sequence of substantially parallel first conductive elements electrically connected in parallel, each having first and second ends and disposed in sequential order as a first pattern upon said substrate, said first conductive elements having unequal electrical lengths and being electrically isolated from each other along said first pattern; and c) a second electrical conductor comprising a sequence of substantially parallel second conductive elements electrically connected in parallel, each having first and second ends, and disposed in sequential order upon said substrate as a second pattern in proximity to elements of said first conductor, said second conductive elements having unequal electrical lengths and being electrically isolated from each other along said second pattern, wherein individual second ends of sequentially longer ones of said first conducting elements are coupled to individual first ends of sequentially shorter ones of said second conductive elements, thereby forming a sequence of substantially equal length, equiresistant conductive path elements from said first ends of said first conductive elements to said second ends of said second conductive elements.

6. The inductive structure according to claim 1, wherein said first pattern is a first spiral and said second pattern is a second spiral.

7. The inductive structure according to claim 1, wherein said first spiral spirals inwardly in a clockwise direction and said second spiral spirals inwardly in a counterclockwise direction.

8. The inductive structure according to claim 1, wherein said dielectric substrate has opposed first and second planar surfaces, with said first electrical conductor disposed on said first planar surface and said second electrical conductor disposed on said second planar surface.

9. The structure defined by claim 8, wherein said first ends of said first conductor are electrically connected, and said second ends of said second conductor are electrically connected, defining a single conductive path formed of separate, parallel, connected, equilength elements.

10. The structure defined by claim 8, wherein said conductors are spiral shaped.

11. The structure defined by claim 8, further comprising:

a) a third electrical conductor comprising a sequence of substantially parallel, electrically isolated conductive elements having a width W and a length L extending between first and second ends, wherein each consecutive element of said third conductor is juxtaposed upon said first surface with each consecutive element of said first conductor; and b) a fourth electrical conductor comprising a sequence of substantially parallel, electrically isolated conductive elements having a width W and a length L extending between first and second ends, wherein each consecutive element of said fourth conductor is juxtaposed upon said second surface with each consecutive element of said second conductor, wherein second ends of said conductive elements of said third conductor are electrically connected inverse sequentially to said first ends of said conductive elements of said fourth conductor, and wherein second ends of said conductive elements of said second conductor are electrically connected sequentially to first ends of said conductive elements of said third conductor thereby forming a sequence of substantially equal length, equiresistant conductive elements.

12. The structure defined by claim 11, wherein said first ends of said conductive elements of said first conductor are electrically connected, and said second ends of said conductive elements of said fourth conductor are electrically connected.

13. The structure defined by claim 8, wherein each of said first and second conductors have a width W, and further wherein a non-conductive region having a width W' is disposed between each element such that W>W'.

14. The structure defined by claim 13, wherein the number of said substantially parallel, electrically isolated, conductive elements having first and second ends is 10, W is approximately equal to 6 μm and W' is approximately equal to 1 μm.

* * * * *